US009708712B2

(12) United States Patent
Carnahan et al.

(10) Patent No.: US 9,708,712 B2
(45) Date of Patent: Jul. 18, 2017

(54) CONDUCTIVE TRANSPARENT FILM AND METHOD FOR MAKING SAME

(71) Applicant: NanoLab, Inc., Waltham, MA (US)

(72) Inventors: David Carnahan, Needham, MA (US);
Krzysztof Kempa, Waltham, MA (US);
Nolan Nicholas, Worcester, MA (US)

(*) Notice: Subject to any disclaimer, the term of this patent is extended or adjusted under 35 U.S.C. 154(b) by 0 days.

(21) Appl. No.: 14/269,368

(22) Filed: May 5, 2014

(65) Prior Publication Data
US 2014/0326697 A1    Nov. 6, 2014

Related U.S. Application Data

(60) Provisional application No. 61/819,371, filed on May 3, 2013.

(51) Int. Cl.
| C23C 18/16 | (2006.01) |
| C25D 1/12 | (2006.01) |
| H01L 31/0224 | (2006.01) |
| H01L 51/52 | (2006.01) |
| H05K 1/09 | (2006.01) |
| B81C 1/00 | (2006.01) |
| G06F 3/041 | (2006.01) |
| H01L 31/18 | (2006.01) |

(Continued)

(52) U.S. Cl.
CPC ...... *C23C 18/1605* (2013.01); *B81C 1/00476* (2013.01); *B81C 1/00523* (2013.01); *B81C 1/00531* (2013.01); *B81C 1/00539* (2013.01); *C23C 14/0005* (2013.01); *C23C 14/024* (2013.01); *C23C 14/046* (2013.01); *C23C 18/1254* (2013.01); *C25D 1/12* (2013.01); *C25D 5/022* (2013.01); *G06F 3/041* (2013.01); *H01L 31/0224* (2013.01); *H01L 31/1884* (2013.01); *H01L 51/5203* (2013.01); *H05K 1/09* (2013.01); *C23C 18/1216* (2013.01); *C23C 18/32* (2013.01); *Y02E 10/50* (2013.01)

(58) Field of Classification Search
CPC ............ B81C 1/00476; B81C 1/00523; B81C 1/00531; B81C 1/00539; B81C 2201/0105–2201/0109; B81C 2201/013–2201/0133; C23C 14/042; C23C 16/042; H01L 31/1884; H05K 1/09
See application file for complete search history.

(56) References Cited

U.S. PATENT DOCUMENTS

| 3,798,477 | A | * | 3/1974 | Soltys | ............................ 313/392 |
| 6,268,060 | B1 | * | 7/2001 | Mokerji | ........................ 428/446 |
| 7,172,822 | B2 | * | 2/2007 | Shibata | ......................... 428/690 |

OTHER PUBLICATIONS

Sardan et al., "Self-assembly-based batch fabrication of nickelt-iron nanowires by electroplating", Nanotechnology, vol. 17, year 2006, pp. 2227-2233.*

(Continued)

*Primary Examiner* — Jiong-Ping Lu
(74) *Attorney, Agent, or Firm* — Pandiscio & Pandiscio

(57) ABSTRACT

A method for the production of a transparent conductor deposit on a substrate, the method comprising:
providing a substrate formed from a first material;
depositing a film of a second material on the substrate;
causing the film to crack so as to provide a plurality of recesses;
depositing a conductive material in the recesses; and
removing the film from the substrate so as to yield a transparent conductive deposit on the substrate.

14 Claims, 7 Drawing Sheets

| Step | Process | Examples |
|---|---|---|
| 0 | Select Substrate & film material | Glasses, polymers, oxides, semiconductors, insulators, conductors |
| 1 | Apply film to substrate | Evaporation, Sputtering, Spraying, dip coating, printing, knife over roll coating, CVD, ALD, spin coating |
| 2 | Crack the film | Drying, curing, thermal expansion, reaction, flexure, elongation, crystallization |
| 3 | Optional: change crack width | Etching, dissolution, reaction, flexure, elastic or plastic deformation |
| 4 | Deposit Material in cracks | Sputtering, plating, electroless deposition, Evaporation, reduction, Spraying, dip coating, spin coating |
| 5 | Strip the film | Etching, dissolving, adhesive transfer, oxidation, reduction |

Overall process flow and example sub-processes

(51) Int. Cl.
*C23C 14/00* (2006.01)
*C23C 14/02* (2006.01)
*C23C 14/04* (2006.01)
*C25D 5/02* (2006.01)
C23C 18/12 (2006.01)
C23C 18/32 (2006.01)

(56) References Cited

OTHER PUBLICATIONS

Alaca, B.E. et al., Guided Self-Assembly of Metallic Nanowires and Channels, Applied Physics Letters, vol. 84, No. 23, Jun. 7, 2004, pp. 4669-4671.
Catrysse, P.B. et al., Nanopatterned Metallic Films for Use as Transparent Conductive Electrodes in Optoelectronic Devices, Nano Letters, 2010, 10, pp. 2944-2949.
Krins, N. et al., Thick and Crack-Free Nanocrystalline Mesoporous TiO2 Films Obtained by Capillary Coating from Aqeous Solutions. Chemistry of Materials, vol. 22, No. 23, Nov. 12, 2010, pp. 6218-6220.
Layani, M. et al., Transparent Conductive Coatings by Printing Coffee Ring Arrays Obtained at Room Temperature, ACS Nano, 2009, vol. 3, No. 11, pp. 3537-3542.
Shin, H. et al., Syntheses and Characterization of TiO2 Thin Films on Organic Self-Assembled Monolayers: Part I. Film Formation From Aqueous Solutions, Journal of Materials Research, Mar. 1995, vol. 10, No. 3, pp. 692-698.
Tokuno, T. et al., Transparent Electrodes Fabricated via the Self-Assembly of Silver Nanowires Using a Bubble Template, Langmuir, May 29, 2012, 28, pp. 9298-9302.
Van De Groep, J. et al., Transparent Conducting Silver Nanowire Networks, Nano Letters, May 3, 2012, 12, pp. 3138-3144.

\* cited by examiner

| Step | Process | Examples |
|---|---|---|
| 0 | Select Substrate & film material | Glasses, polymers, oxides, semiconductors, insulators, conductors |
| 1 | Apply film to substrate | Evaporation, Sputtering, Spraying, dip coating, printing, knife over roll coating, CVD, ALD, spin coating |
| 2 | Crack the film | Drying, curing, thermal expansion, reaction, flexure, elongation, crystallization |
| 3 | Optional: change crack width | Etching, dissolution, reaction, flexure, elastic or plastic deformation |
| 4 | Deposit Material in cracks | Sputtering, plating, electroless deposition<br><br>Evaporation, reduction<br><br>Spraying, dip coating, spin coating |
| 5 | Strip the film | Etching, dissolving, adhesive transfer, oxidation, reduction |

Fig 1. Overall process flow and example sub-processes

FIG. 1

Fig 2. Pictorial Process Flow for one favored embodiment employing a sol gel film layer, cracked by crosslinking, followed by silver deposition.

Fig. 3. Crack dimensions can tailored with spin coating parameters: speed vs. time.

Fig 4. Comparison of optical transmittance between ITO and cracked nano-networks on glass and PET Fig. 5. The plot of transmittance as a function of sheet resistance shows the tailorability of the structure. Inset shows the figure of merit for transparent conductors, with ITO and AZO for comparison

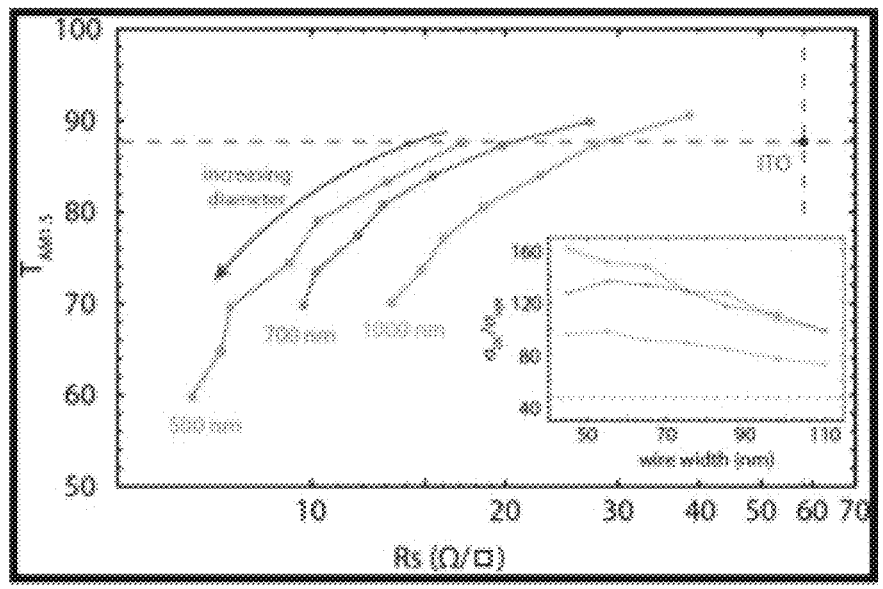

Fig 6. The averaged transmission as a function of sheet resistance for networks with 500, 700, and 1000 nm crack lengths. The dashed lines show the transmittance and resistance of an 80nm thick ITO film sputtered on glass. The inset shows the figure of merit, defined as the ratio of the electrical conductance to the average optical conductance, as a function of wire width in nm. The dashed line indicates the figure of merit for ITO.

FIG. 6

Fig. 7 Sheet resistance of a cracked nano network as a function of bending angle.

CONDUCTIVE TRANSPARENT FILM AND METHOD FOR MAKING SAME

REFERENCE TO PENDING PRIOR PATENT APPLICATION

This patent application claims benefit of prior U.S. Provisional Patent Application Ser. No. 61/819,371, filed May 3, 2013 by David Carnahan et al. for CONDUCTIVE TRANSPARENT FILM AND METHOD OF MAKING SAME, which patent application is hereby incorporated herein by reference.

FIELD OF THE INVENTION

This invention relates to conductive films in general, and more particularly to conductive films that can be engineered to be transparent to, or block various wavelengths of, radiation.

BACKGROUND OF THE INVENTION

In the field of optics and electronics, applications such as solar cells and touch-screen displays commonly utilize transparent conductors.

Transparent conductors are typically formed out of indium tin oxide (ITO). Transparent coatings utilizing carbon nanotubes or metal nanowires have been proposed. ITO is relatively expensive, and is commonly deposited using expensive vacuum-based processes. In addition, ITO lacks flexibility. Nanotube-based films have not demonstrated the right combination of wear resistance, conductivity, cost and transparency to displace ITO in the marketplace.

Accordingly, a method to create a conductive, transparent thin film that can provide lower cost or simplified production would be useful in the art.

SUMMARY OF THE INVENTION

The present invention provides a new conductive transparent film and a method for making the same. In one preferred form of the invention, the new conductive transparent film comprises a percolating network of nanowires on a substrate, sometimes hereinafter referred to as a cracked nano network. The network of interconnected nanowires on a substrate can be produced in a multistep process, by first depositing a thin film of a material on the substrate and then causing that film to crack or "craze" across the surface. A second material (e.g., a metal) can then be deposited in these cracks in this film. Once the second material is deposited, the first material can be removed, to leave only the second material on the substrate. Among other things, when the second material (e.g., a metal) is deposited over the cracked film, the areas where the substrate is exposed receive the second material (e.g., a metal). Once stripped of the cracked film, the substrate is patterned with the second material (e.g., a metal), reflecting the crack pattern in the cracked film.

In one preferred form of the present invention, there is provided a method for the production of a transparent conductor deposit on a substrate, the method comprising:
  providing a substrate formed from a first material;
  depositing a film of a second material on the substrate;
  causing the film to crack so as to provide a plurality of recesses;
  depositing a conductive material in the recesses; and
  removing the film from the substrate so as to yield a transparent conductive deposit on the substrate.

In another preferred form of the present invention, there is provided a method for the production of a patterned deposit on a substrate, the method comprising:
  depositing a film on a substrate, wherein the substrate comprises a first material and the film comprises a second material;
  causing the film to crack so as to provide a plurality of recesses;
  depositing a third material in the recesses; and
  removing the film from the substrate, whereby to provide a patterned deposit on the substrate.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts, and further wherein:

FIG. 1 illustrates the overall process flow of the present invention, with example options for sub-processes;

FIG. 6 plots the optical transmittance at wavelength=550 nm versus the sheet resistance for deposits with the same d=2 μm, and different w changing from 10 to 200 μm—the corresponding curve for ITO is also shown, and the inset is the plot of $\sigma_{dc}/\sigma_{opt}$ as a function of w, along with the $\sigma_{dc}/\sigma_{opt}$ of a 150 nm thick layer of ITO, a 600 nm thick layer AZO sputtered on glass, respectively, and the up arrow shows the change trends of w and transmittance and sheet resistance.

DETAILED DESCRIPTION OF THE PREFERRED EMBODIMENTS

Figure 2:
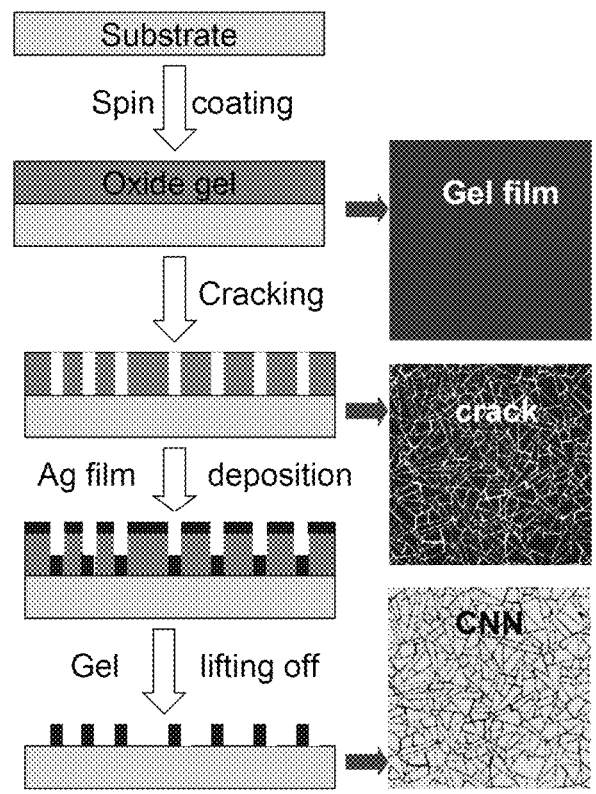
FIG. 2 pictorially illustrates a process flow using a favored embodiment, where a sol-gel film is deposited, cracked by crosslinking, and then overcoated with silver prior to stripping the film.
Figure 3:
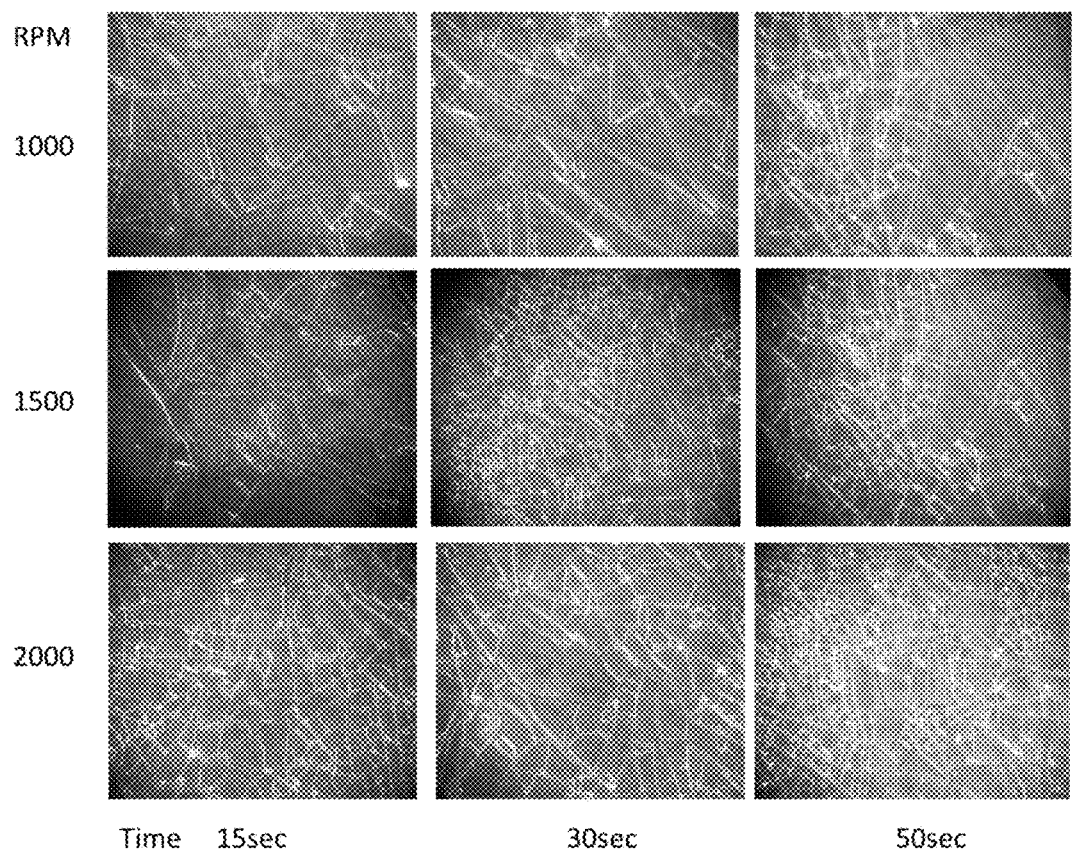
FIG. 3 illustrates one method to control crack dimensions, wherein a series of optical microscopy images show cracks in an acrylic resin (Lubrizol Carboset CA 600) after spin coating onto glass substrates and air drying—as the spin coating speed and time increases, the crack length and width both decrease.
Figure 4:
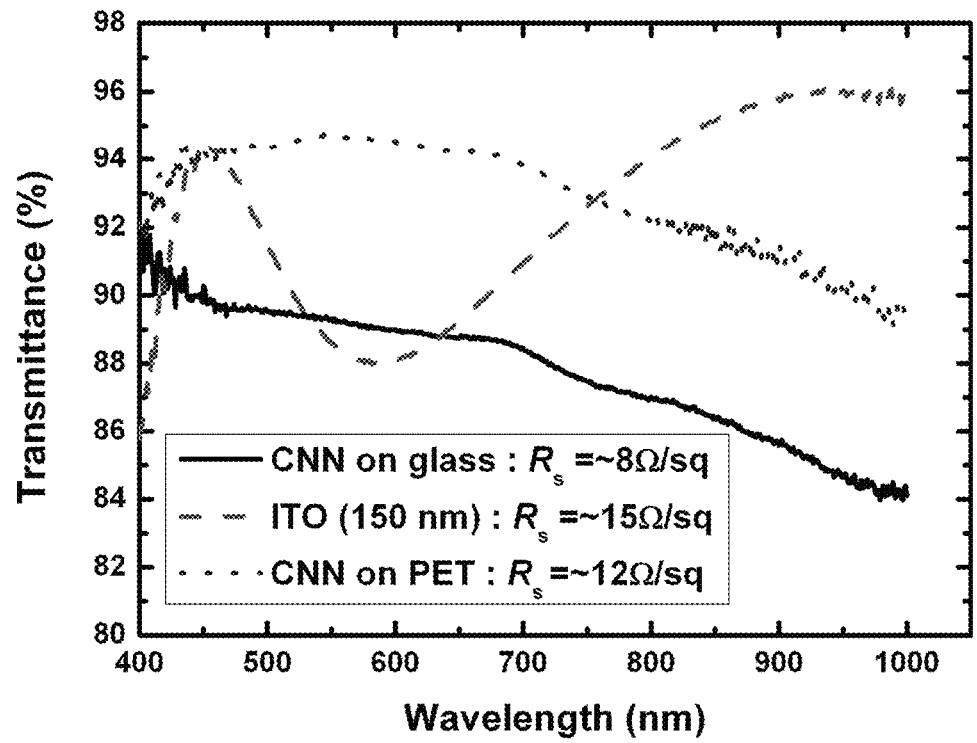
FIG. 4 shows the optical normalized transmittance (normalized to the transmission through a bare glass or PET) of a silver deposit as a function of wavelength, for parameters length (w) and width (d)—the transmittance increases with w (for fixed d) and decreases with d (for fixed w)—the coating is almost transparent (T ~94%) when w approaches 200 μm.
Figure 5:
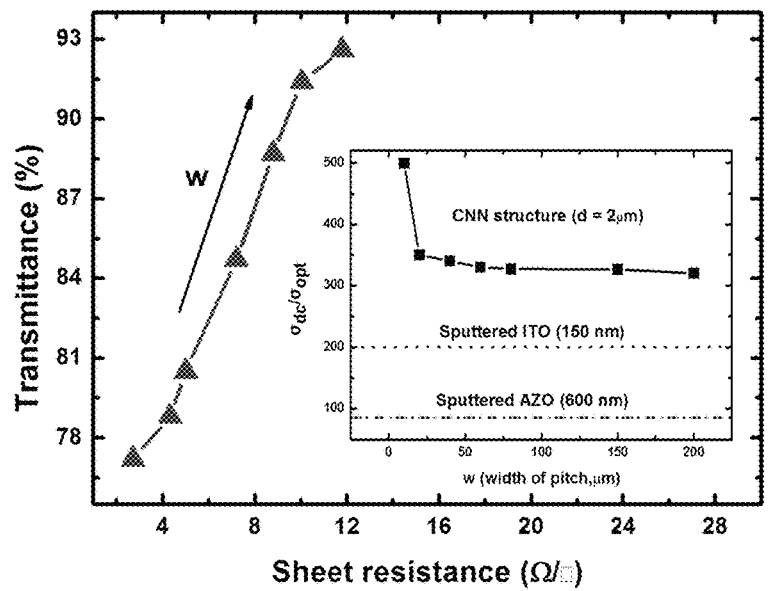
FIG. 5 compares the transmittance of deposits with w=20 μm and d=2 μm, on glass and PET substrates, to that of an ITO-coated (~150 nm thick) on a glass substrate—deposits on glass and PET exhibit excellent transparency (~88%) from 400 to 700 nm, which is comparable or better than ITO, and their sheet resistances are lower than that of the ITO.
Figure 7:
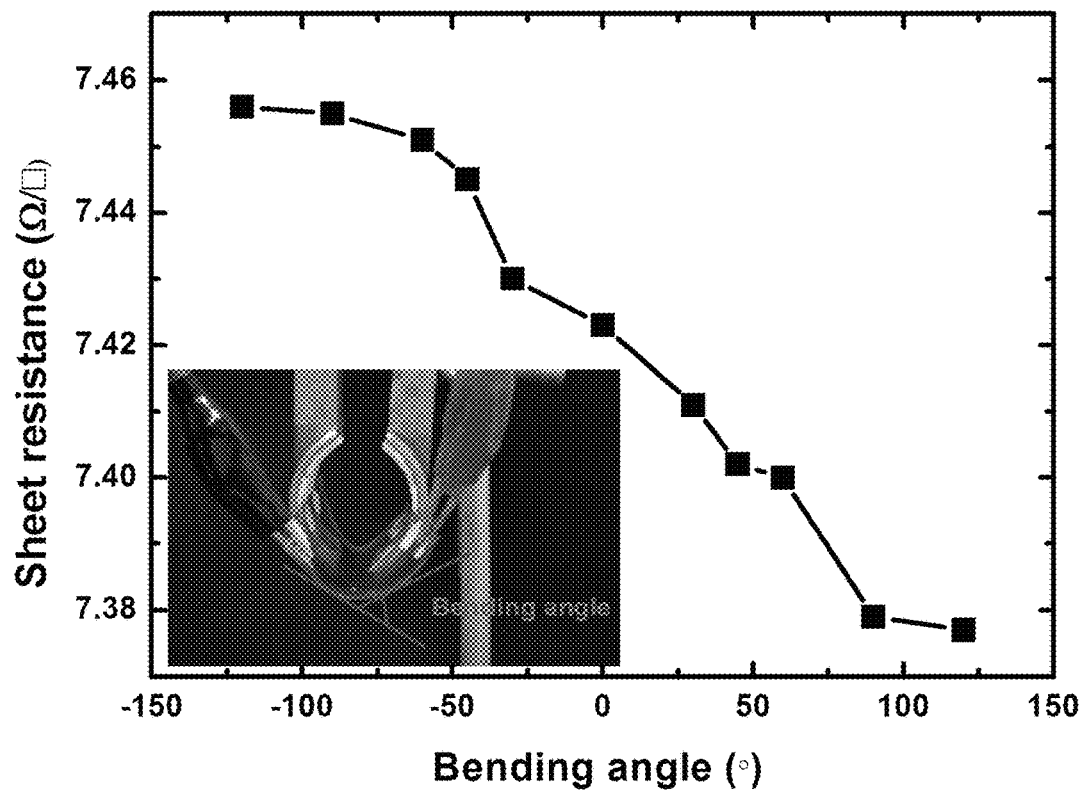
FIG. 7 shows the effect of bending on the coating—the inset shows the experimental setup of the two-probe electrical measurement, and the electrical contact to the film was made by alligator clips with a small amount of silver paste.

The present invention provides a new conductive transparent film and a method for making the same. In one preferred form of the invention, the new conductive transparent film comprises a percolating network of nanowires on a substrate, sometimes hereinafter referred to as a cracked nano network. The network of interconnected nanowires on a substrate can be produced in a multistep process, by first depositing a thin film of a material on the substrate and then causing that film to crack or "craze" across the surface. A second material (e.g., a metal) can then be deposited in these cracks in this film. Once the second material is deposited, the first material can be removed, to leave only the second material on the substrate.

Process for Forming a Conductive Transparent Film

The process disclosed herein comprises multiple steps, including the creation of a film of a material on a substrate, the cracking of that film, optionally altering the crack dimensions, the deposition of a second material into the cracks, and the stripping of the first material while leaving the second material intact where it contacts the substrate. The resulting pattern of the second material on the substrate reflects the crack pattern.

The following sections describe the various methods by which the multiple steps of the process can be executed. Certain combinations of these methods are favored embodiments of the present invention.

1. Substrates and Methods to Deposit a Film on a Substrate

Multiple types of substrates can be coated with the conductive deposit of this invention. Non-limiting examples of these substrate materials include: insulators such as ceramics (e.g., metal oxides, carbides and nitrides, or their precursors, and glass), polymers (e.g., polycarbonates, acrylics, and other polymers with high optical transparency), direct bandgap semiconductors (e.g., gallium arsenide, indium phosphide, gallium antimonide, all of which have direct optical transitions), and indirect bandgap semiconductors (e.g., Si, Ge, etc., although these are not transparent in the visible spectrum). It should also be appreciated that metals could also be coated with this process, but metals lack optical transparency.

The materials that can be deposited upon these substrates as a film include all of the above substrate materials, with the condition that the combination of the substrate material and the film material have a mismatch in some property that leads to mechanical stress, or the film material itself must generate these stresses, in order to facilitate cracking of the film (see below). Methods for depositing the film material on the substrate include, but are not limited to: spraying, knife-over-roll coating, spin coating, dip coating, electrophoretic deposition, plating, sputtering, chemical vapor deposition, evaporation, atomic layer deposition, molecular beam epitaxy, etc.

The film material (and process for depositing the same) must generate a thin film that can be cracked, so it is necessary to build up stress in that film without adversely affecting the substrate. It should be appreciated that different types of stresses can be employed to generate the stresses necessary to crack the film on the substrate, including but not limited to: thermal stresses, drying stresses, crosslinking (curing) stresses, flexure stresses, elongation stresses, acoustic vibration stresses, etc.

2. Methods to Generate Cracks

2A. Method to Generate Cracks Using Thermal Stresses in a Low Expansion Substrate For a substrate having a low thermal expansion coefficient, a film having a much higher thermal expansion coefficient can be applied to the substrate. By cooling the pair, tensile stresses will build up in the film in proportion to the mismatch of the thermal expansion coefficients between the film and substrate. So long as the film is thin with respect to the substrate, fractures will occur preferentially in the film layer. For this invention in general, films that deform elastically, i.e., strain builds up with deformation, without plastic deformation (i.e., flow), are preferred. Note that cooling polymer films can cause plastic materials to go below their glass transition temperature, where they become rigid. Once such a film has been cooled to below its glass transition temperature, rapid cooling to a lower temperature builds significant stress in the film, which can lead to cracking.

2B. Method to Generate Cracks Using Thermal Stresses in a High Expansion Substrate For a substrate with a high thermal expansion coefficient, a thin film having a lower thermal expansion coefficient may be applied to the substrate. By heating the pair, tensile stresses will be generated in the film, which can lead to the desired cracking. Again, a rigid, non-plastically deforming film material is preferred, so that the stresses lead to crack generation.

2C. Method to Generate Cracks Using Stresses Due to Drying

Film coatings that are applied to substrates can build stress on drying. This is commonly observed in mud flats, where the surface dries more rapidly than the mud below, and the corresponding drying shrinkage leads to "crazing" across the surface. Drying shrinkage can occur in systems with particulates, such as ceramic slurries, as capillary forces pull particles together as the film dries. The combination of a substrate that is static, and a film that shrinks upon drying, will lead to a crazed network of cracks.

2D. Method to Generate Cracks Using Crosslinking and Other Reactions

It is known that the crosslinking (curing) reaction between chemical compounds (such as epoxies, acrylics, various organic molecules, etc.) can cause shrinkage. These can be identified by systems that have a higher density in their cured state than the constituent components. Other reactions liberate water or other species on crosslinking, and these byproducts of the reaction are volatile enough to separate from the cured material, causing the cured material to shrink.

2E. Method to Generate Cracks Using Mechanical Forces

For a flexible substrate and a rigid coating, simple elastic deformation of the substrate can generate sufficient stress to crack the coating. Such mechanically-induced stresses may be very directional, and thereby create directional cracks. Predominantly aligned cracks may be created with rollers, where the bottom of the substrate touches the roller surface, and the coating is applied to the top surface of the substrate. In this scenario, with only elastic deformation of the substrate, the crack width may be reduced on the removal of the stress. As such, it may be useful to employ a small amount of plastic deformation in the substrate, so that after the stress is removed, the coating cannot close the cracks completely. Alternatively, other methods to change the crack width to enable deposition into the crevices may be utilized. Other useful crack geometries can be obtained from Hertzian impact, which tends to create a roughly circular fracture pattern, combining radial cracks with circumferential cracks.

3. Methods to Control or Adjust Crack Dimensions

It may be desirable to control the dimensions of the cracks created by the aforementioned process. More particularly, as the cracks are generated by stresses, controlling the stresses, and the coating's response to those stresses, may be desirable. Physical parameters, such as the thickness of the coating, adhesion to the substrate, modulus of the coating, and the presence of stress concentrating features, etc., will influence the response of the coating to stress. The stresses can be controlled by regulating the rates of stress application, such as the heating rate and maximum temperature, or the elongation rate and maximum elongation.

Once a cracked network is created, it can optionally be treated to either "heal" or widen the cracks. The coating material may be susceptible to an etchant or solvent, which can preferentially attack any areas of higher surface energy and greater surface area. Outside edges and crack walls may be preferentially attacked. High expansion coefficient substrates can be heated before, and during, the deposition of the coating so as to expand the crack width.

4. Methods to Deposit Materials into the Cracks

It is recognized that many processes can be employed to deposit a second material (e.g., a metal) into the cracked films. All of the so-called "line of sight" processes, such as spraying, evaporation, sputtering, etc., can be employed. Other "non-line of sight" processes can also be employed, such as electroless deposition (ELD), atomic layer deposition (ALD), chemical vapor deposition (CVD), electroplating, etc., although this last process (i.e., electroplating) requires a conductive substrate initially. Alternatively, the substrate, if a metal oxide, may be reduced to its metallic form in the areas exposed by the crack. Cracking forces can also induce separation at the substrate/film interface, creating "curl". In this situation, line of sight techniques are preferred, as they will keep the deposited line more sharply defined.

4A. Electroless Plating

A method to encourage deposition of a second material (e.g., metal) in the cracks in the coating, primarily at the substrate surface, can be realized by sensitizing and activating the surface of the substrate before the deposition of the coating layer. In this way, where the cracks expose a portion of the substrate surface, that surface is catalytic to the reaction that leads to electroless deposition of the second material (e.g., a metal). Common sensitizers and activators include tin and palladium chlorides. The specificity of the electroless reaction is such that surfaces that lack these activating species do not participate, and remain uncoated.

5. Methods to Strip the Thin Film Coating

The stripping process will depend upon on the nature of the material used to coat the substrate, but must not remove the material deposited in the cracks in the thin film coating. Processes that can be employed include, but are not limited to, solvent dissolution, etching in an etchant (such as acids or bases), thermal oxidation, melting, adhesive transfer, plasma etching, etc.

Product

It will be appreciated that, by first depositing a thin film of a material on a transparent substrate, then causing that film to crack or "craze" across the surface, depositing a second, conductive material (e.g., a metal) in these cracks in the film, and thereafter removing the thin film of the first material, a nano-network of conductive wire is deposited on the transparent substrate. In this way, a conductive transparent thin film is produced.

FAVORED EMBODIMENTS

Certain combinations of the preceding five steps constitute favored embodiments of the present invention.

Favored Embodiment 1

From Step 1: A glass substrate, which is coated with a fumed aluminum oxide (Aeroxide Alu C, Degussa) aqueous suspension with a concentration of 2 g/10 ml, which will then undergo a drying process. The slurry was successfully coated using spin coating, drop coating, and doctor blade coating.

From Step 2A: The slurry, when dried in ambient air, heated air, or in vacuum, will crack due to drying stresses.

From Step 3: No extra processing.

From Step 4: A chromium adhesion layer of 10 nm thickness, followed by a silver layer of 60 nm thickness, was sputtered on the substrate.

From Step 5: The dried alumina and overcoating of silver was removed using a roller coated with a tacky film.

The thickness of the coating was varied and the drying conditions were also varied, but in all cases a cracked network was observed. The concentration of the particles in the slurry was noted to influence the crack dimensions. Additions of plasticizing binders were observed to reduce the tendency for cracking.

Favored Embodiment 2

From Step 1: A polyethylene terephthalate (PET) substrate, having a flexible, moderate thermal expansion coefficient, which is dip coated with a gelatin solution, which will then undergo a gelation process.

From Step 2C: The gelatin, when rapidly dried, will contract and crack due to drying stresses.

From Step 3: No extra processing.

From Step 4: Aluminum is evaporated on the substrate.

From Step 5: The dried gelatin and extra aluminum is removed by a rinse in hot water.

The advantages of this preparation is the low environmental impact of the process. The waste from Step 5 may be separated into its components (water, gelatin and aluminum) and recycled or separately disposed.

Favored Embodiment 3

From Step 1: A glass substrate, having a low thermal expansion coefficient, which is spin coated with a sugar solution which will solidify to a brittle, glassy state with high thermal expansion coefficient.

From Step 2C: The sugar film, when rapidly cooled, will contract and crack due to differential thermal expansion stresses.

From Step 3: No extra processing.

From Step 4: Gold is deposited by sputtering on to the substrate.

From Step 5: The sugar and extra gold is removed by a rinse in hot water.

This process shares advantages of the Favored Embodiment 2 above, in low environmental impact. The waste from Step 5 may be separated into its components (water, sugar and gold) and recycled or separately disposed.

Favored Embodiment 4

From Step 1: A rigid silica glass substrate, which is spin coated with a photoresist, such as SU-8, which is then soft baked at 95 C.

From Step 2D: The resist when fully crosslinked, undergoes a ~7.5% contraction, which can be sufficient to crack the film, or can be hard baked to 200 C.

From Step 3: The SU-8 resist is etched with an oxygen plasma to widen the cracks to ~0.5 micron.

From Step 4: Nickel, ~0.5 micron thick, is deposited using an electroless chemical deposition method.

From Step 5: Highly crosslinked, UV-exposed SU8 can be dissolved using solvents such as N-methylpyrrolidone (NMP), or etchants such as hydrochloric acid, sulfuric acid, and pirhana etchants (H2SO4 and H2O2).

The advantage of this preparation is the use of commonly used materials in cleanroom operations.

Favored Embodiment 5

From Step 1: A glass or poly(ethylene terephthalate) (PET) substrate, which is spin coated with an oxide gel of microcrystalline TiO2 solution. The solution was synthesized by a sol-gel process, following the method of Shin (Shin, H.; Collins, R.; De Guire, M.; Heuer, A.& Sukenik, C. Synthesis and characterization of TiO2 thin films on organic self-assembled monolayers: Part I. Film formation from aqueous solutions. Journal of Materials Research (1995), 10, 692-698.)

From Step 2C and 2D: When the TiO2 film is heated, it shrinks and cracks due to drying and crosslinking reactions. Methods to mitigate this cracking were documented by Krins (Krins, N.; Faustini, M.; Louis, B.& Grosso, D. Thick and crack-free nanocrystalline mesoporous TiO2 films obtained by capillary coating from aqueous solutions. Chemistry of Materials (2010), 22, 6218-6220).

From Step 3: No extra processing.

From Step 4: Metal sputtering or evaporation of silver is used, followed by TiO2 lift-off, leaving the metal network crack pattern. From Step 5: Lift-off was performed by wiping the TiO2 with a cloth, followed by 1 min of ultra-sonification in anisol.

This last preparation facilitates the tune-ability of the system.

Alternative Embodiments: Use of Organic Hydrocolloids as Facile Green Chemical Routes to Cracked Nano-Networks A variety of organic materials are known to form hydrocolloids in suitably chosen environmental conditions. These include simple ionic polymers such as polyacrylic acid, soluble gel forming proteins such as gelatin, and polysaccharides such as alginates, carrageenans, pectins, guar gum, locust bean gum, etc. Under appropriate conditions, films produced from aqueous dispersions of these materials will form cellular crack-networks when subjected to strain-inducing treatments such as drying. These materials provide processing routes to producing cracked nano-network films which are environmentally safe, non-toxic and industrially advantageous in their composition and processing chemistries.

In a certain embodiment, gel films can be deposited onto a substrate in the form of a molecular solution or particulate sol state so that the resulting gel material contains a significant amount of solvent and is in a swollen state. This solvent is then removed by drying, either from the liquid state (to form a xerogel) or by freeze drying (to form a cryogel). This loss of solvent then leads to film shrinkage and crack network formation in the film.

In an exemplary embodiment, gelatin can be utilized to form films on glass by dissolving gelatin in aqueous or mixed (e.g., water-ethanol) solvents—often these solvents will include buffers to modify pH and/or ionic strength. When dried under suitably chosen conditions, such films will form cracked nano-network patterns of the type taught herein. Drying at relatively low temperature and low humidity will typically enhance the crack network formation.

In certain embodiments, it is advantageous to utilize gel materials which can be cross-linked to chemically and morphologically stabilize the gels during utilization of the cracked nano-networks—particularly use in liquid environments, where the gels might otherwise be subject to significant shape alteration or dissolution. It is often particularly advantageous to utilize cross-linking mechanisms which can be easily reversed to de-crosslink the gel material in order to resolubilize it in an appropriate solvent. Such chemistries are well known in the literature: primary examples of such reversible cross-linking chemistries include ionic cross-linking and reversible covalent cross-linking.

Ionic cross-linking gelation is well known for a variety of gel-forming polymers including pectin, alginate, carrageenan, gellan gum, and polyacrylic acid. Often polyvalent ions are utilized to drive ionic gelation (e.g., $Ca^{2+}$ for low methoxy and amidated pectin and alginates, or $Fe^{3+}$ for polyacrylic acid). Ionic cross-linking can provide significant stability against re-dissolution of the gel during further solvent processing and even reduce swelling. For instance, a cracked nano-network can be formed from low methoxy pectin using calcium ion gelation and film drying. Then this film can be stabilized by soaking the pectin in a non-solvent (e.g., ethanol) with a relatively high concentration of calcium ions—which lead to a compact gel network; and conducting subsequent liquid processing in a high-calcium-concentration environment which will enable the pectin to retain its compact, syneretic form.

Alternatively, reversible, covalent cross-linking chemistries can also be utilized to enable cracked nano-network films with enhanced stability. For instance, keratin films can be produced by using denatured keratin (in which the disulfide bonds have been reduced to thiols) which is soluble in aqueous alkali solutions. Upon deposition and formation of desirable morphologies (e.g. crack networks), the film can be cross-link stabilized by re-formation of disulfide bonds using oxidative chemistry according to standard chemical techniques. And the films can be re-solubilized by reductive cleavage of these disulfide bonds to thiols. Similarly, polysaccharides containing adjacent cis diol groups (such as guar gum or locust bean gum) can be cross-linked through the addition of borates, where the borates form a pH sensitive ester linkage which is easily reversible and can be utilized in a manner analogous to that described above.

Optical Properties of the Cracked Nano-Networks

The conductive structures (i.e., the nano-networks of wire created by depositing a metal in a cracked thin film and then removing the cracked thin film) were characterized by the wire length (w), varying from 20 μm to 200 μm, and the wire width (d), varying from 2 micron to 20 micron. The parameters of the conductive wire structures were controllable with film thickness, cracking temperature, and ratio of reactive components. Optical transmission measurements were performed by employing a fiber-optic spectrometer (Ocean Optics, USB 4000), and an integration sphere (Ocean Optics, FOIS-1) in the spectral range from 400~1000 nm. The properties were measured as a function of wavelength, for parameters w and d. As expected, the transmittance increases with wire length w (for fixed wire width d), and decreases with wire width d (for fixed length w). The deposit can become nearly transparent (T ~94%) when w approaches 200 μm.

The transmittance of optimized deposits with w=20 μm and d=2 μm, on glass and PET substrates, can be compared to an ITO-coating (~150 nm thick) on a glass substrate. Both CNN electrodes (based on glass and PET) exhibit excellent transparency (~88%) from 400 to 700 nm, which is comparable to or better than ITO. For these samples, the measured sheet resistances was lower than that of the ITO, when measured using a four-point probe method.

It should be appreciated that optical transmittance and DC conductivity change in opposite directions for transparent conductors, and the present invention provides exceptional flexibility in controlling these parameters by varying, independently, w and d.

Additional Features of the Invention

It should be appreciated that, if the average crack length is controlled, the nano-network of conductive wire will be optically transparent to wavelengths that are mis-matched to the characteristic dimension of the cracks. Wavelengths of radiation that are matched to, or multiples of, a characteristic dimension, may create a condition where the network of wires will serve as a notch filter.

Metals such as gold and silver have plasmon resonances that may be accessed by properly sizing the dimensions of the nanoscale network of conductive wire.

Modifications of the Preferred Embodiments

It should be understood that many additional changes in the details, materials, steps and arrangements of parts, which have been herein described and illustrated in order to explain the nature of the present invention, may be made by those skilled in the art while still remaining within the principles and scope of the invention.

What is claimed is:

1. A method for the production of a transparent conductive deposit on a transparent polymeric substrate, the method comprising:
   providing a transparent polymeric substrate formed from a first material;
   depositing a film of a second material on the transparent polymeric substrate;
   causing the film to crack so as to provide a plurality of fissures in the film;
   after providing the plurality of fissures, widening the plurality of fissures so as to create a plurality of recesses, wherein widening the plurality of fissures is achieved independently of providing the plurality of fissures, and further wherein the plurality of fissures are widened using a process selected from the group consisting of elastic deformation and plastic deformation;
   depositing a conductive material in the plurality of recesses; and
   removing the film from the transparent polymeric substrate so as to yield a transparent conductive deposit on the transparent polymeric substrate, wherein the transparent conductive deposit has an optical transparency of at least 88% in a wavelength range of 400 nm to 700 nm.

2. A method according to claim 1 wherein the first material is selected from the group consisting of a thermoset polymer and a thermoplastic polymer.

3. A method according to claim 1 wherein the second material comprises a higher elastic modulus and a more brittle fracture mode than the first material, and further wherein the second material is selected from the group consisting of a protein, a sugar, a starch, a polymer, a ceramic slurry, a ceramic precursor, a sol-gel, a nitride, a carbide, a photoresist, and a combination thereof.

4. A method according to claim 1 wherein the film is deposited on the transparent polymeric substrate using a process selected from the group consisting of dip coating, spin coating, knife-over-roll coating, evaporation, chemical vapor deposition, atomic layer deposition and electrophoretic deposition.

5. The method of claim 1 where the conductive material is deposited in the plurality of recesses using a process selected from the group consisting of spraying, painting, sputtering, evaporation, chemical vapor deposition, atomic layer deposition, electrophoretic deposition, chemical reduction, electroless plating and electroplating.

6. A method according to claim 1 where the film is removed from the transparent polymeric substrate using a process selected from the group consisting of etching, heating, melting, oxidation, adhesive transfer and reaction.

7. A method according to claim 1 wherein the dimensions of the plurality of recesses are tailored so as to provide the transparent conductive deposit with specific electrical and optical properties.

8. A method according to claim 7 wherein the specific property is the reflectivity in a particular range of the spectrum.

9. A method according to claim 1 wherein cracking is effected using a process selected from the group consisting of curing or crosslinking, drying, elongation, flexure, impact, stretching and reaction.

10. A method for the production of a transparent conductive deposit on a transparent polymeric substrate, the method comprising:
    providing a transparent polymeric substrate formed from a first material;
    depositing a film of a second material on the transparent polymeric substrate;
    causing the film to crack so as to provide a plurality of recesses;
    depositing a conductive material in the plurality of recesses; and
    removing the film from the transparent polymeric substrate so as to yield a transparent conductive deposit on the transparent polymeric substrate, wherein the transparent conductive deposit has an optical transparency of at least 88% in a wavelength range of 400 nm to 700 nm;
    wherein, after causing the film to crack and before depositing a conductive material in the plurality of recesses, the plurality of recesses are widened; and
    wherein the plurality of recesses are widened using a process selected from the group consisting of elastic deformation and plastic deformation.

11. A method for the production of a transparent conductive patterned deposit on a transparent polymeric substrate, the method comprising:
    depositing a film on a transparent polymeric substrate, wherein the transparent polymeric substrate comprises a first material and the film comprises a second material;
    causing the film to crack so as to provide a plurality of fissures in the film;
    after providing the plurality of fissures, widening the plurality of fissures so as to create a plurality of recesses, wherein widening the plurality of fissures is achieved independently of providing the plurality of fissures, and further wherein the plurality of fissures are widened using a process selected from the group consisting of elastic deformation and plastic deformation;
    depositing a third material in the plurality of recesses, wherein the third material is a conductive material; and removing the film from the transparent polymeric substrate, whereby to provide a transparent conductive patterned deposit on the transparent polymeric substrate, wherein the transparent conductive patterned deposit has an optical transparency of at least 88% in a wavelength range of 400 nm to 700 nm.

12. A method according to claim 11 wherein the dimensions of the plurality of recesses are controlled so as to result in a patterned deposit having hydrophobic properties.

13. A method according to claim 11 wherein the dimensions of the plurality of recesses are tailored so as to provide a patterned deposit on the transparent polymeric substrate having properties that inhibit or impede bacterial colonization.

14. A method according to claim 11 wherein cracking is effected using a process selected from the group consisting of curing or crosslinking, drying, elongation, flexure, impact, stretching and reaction.

* * * * *